(12) United States Patent
Noorbakhsh et al.

(10) Patent No.: US 10,847,347 B2
(45) Date of Patent: Nov. 24, 2020

(54) EDGE RING ASSEMBLY FOR A SUBSTRATE SUPPORT IN A PLASMA PROCESSING CHAMBER

(71) Applicant: Applied Materials, Inc., Santa Clara, CA (US)

(72) Inventors: Hamid Noorbakhsh, Oakland, CA (US); Anwar Husain, Pleasanton, CA (US); Reyn Wakabayashi, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/415,723

(22) Filed: May 17, 2019

(65) Prior Publication Data

US 2020/0066495 A1 Feb. 27, 2020

Related U.S. Application Data

(60) Provisional application No. 62/722,000, filed on Aug. 23, 2018.

(51) Int. Cl.
*H01L 21/683* (2006.01)
*H01J 37/32* (2006.01)
*H01L 21/687* (2006.01)

(52) U.S. Cl.
CPC .. *H01J 37/32495* (2013.01); *H01J 37/32082* (2013.01); *H01J 37/32385* (2013.01);
(Continued)

(58) Field of Classification Search
CPC ............... Y10T 279/23; H01L 21/4871; H01L 21/6833; H01L 21/68721; H01L 21/68735;
(Continued)

(56) References Cited

U.S. PATENT DOCUMENTS 8,270,141 B2 * 9/2012 Willwerth ........... H01L 21/6833
361/234
9,349,618 B2 * 5/2016 Yamawaku ....... H01L 21/67069
(Continued)

OTHER PUBLICATIONS

Office Action issued in corresponding Taiwanese Patent Application No. 108210495, dated Sep. 16, 2019 (4 pages).
(Continued)

*Primary Examiner* — Eric A. Gates
*Assistant Examiner* — Chwen-Wei Su
(74) *Attorney, Agent, or Firm* — Patterson + Sheridan LLP

(57) ABSTRACT

The present disclosure generally relates to apparatuses and methods for controlling a plasma sheath near a substrate edge. The apparatus relates to a processing chamber and/or a substrate support that includes an edge ring assembly with an edge ring electrode and an electrostatic chuck with a chucking electrode. The edge ring assembly is positioned adjacent the electrostatic chuck, such as with the edge ring assembly positioned exterior to or about the electrostatic chuck. The edge ring assembly includes a base and a cap positioned above the base with the edge ring electrode positioned between the cap and the base. The base of the edge ring electrode may include an inner recess and/or an outer recess with the cap including one or more lips that extend into the inner recess and/or the outer recess. One or more silicon rings and/or insulating rings are positioned adjacent the edge ring assembly.

16 Claims, 13 Drawing Sheets

(52) U.S. Cl.
  CPC .. *H01J 37/32467* (2013.01); *H01J 37/32541* (2013.01); *H01J 37/32568* (2013.01); *H01J 37/32633* (2013.01); *H01J 37/32715* (2013.01); *H01L 21/6833* (2013.01); *H01L 21/68721* (2013.01); *H01L 21/68735* (2013.01); *Y10T 279/23* (2015.01)

(58) Field of Classification Search
  CPC .......... H01J 37/32495; H01J 37/32385; H01J 37/32541; H01J 37/32568; H01J 37/32633; H01J 37/32715; H01J 37/32082; H01J 37/2642; H01J 37/32467
  See application file for complete search history.

(56) References Cited

U.S. PATENT DOCUMENTS

| | | | |
|---|---|---|---|
| 9,852,889 B1* | 12/2017 | Kellogg | H01J 37/32091 |
| 2010/0326957 A1* | 12/2010 | Maeda | H01J 37/32642 216/67 |
| 2018/0366305 A1 | 12/2018 | Nagami et al. | |
| 2019/0131115 A1* | 5/2019 | Gu | H01L 21/67109 |
| 2019/0164727 A1* | 5/2019 | Sugawa | H01L 21/68735 |
| 2019/0172688 A1 | 6/2019 | Ueda | |
| 2019/0333785 A1 | 10/2019 | Tanikawa | |

OTHER PUBLICATIONS

Chinese Office Action dated Jan. 22, 2020 for Application No. 201921485674.X.

\* cited by examiner

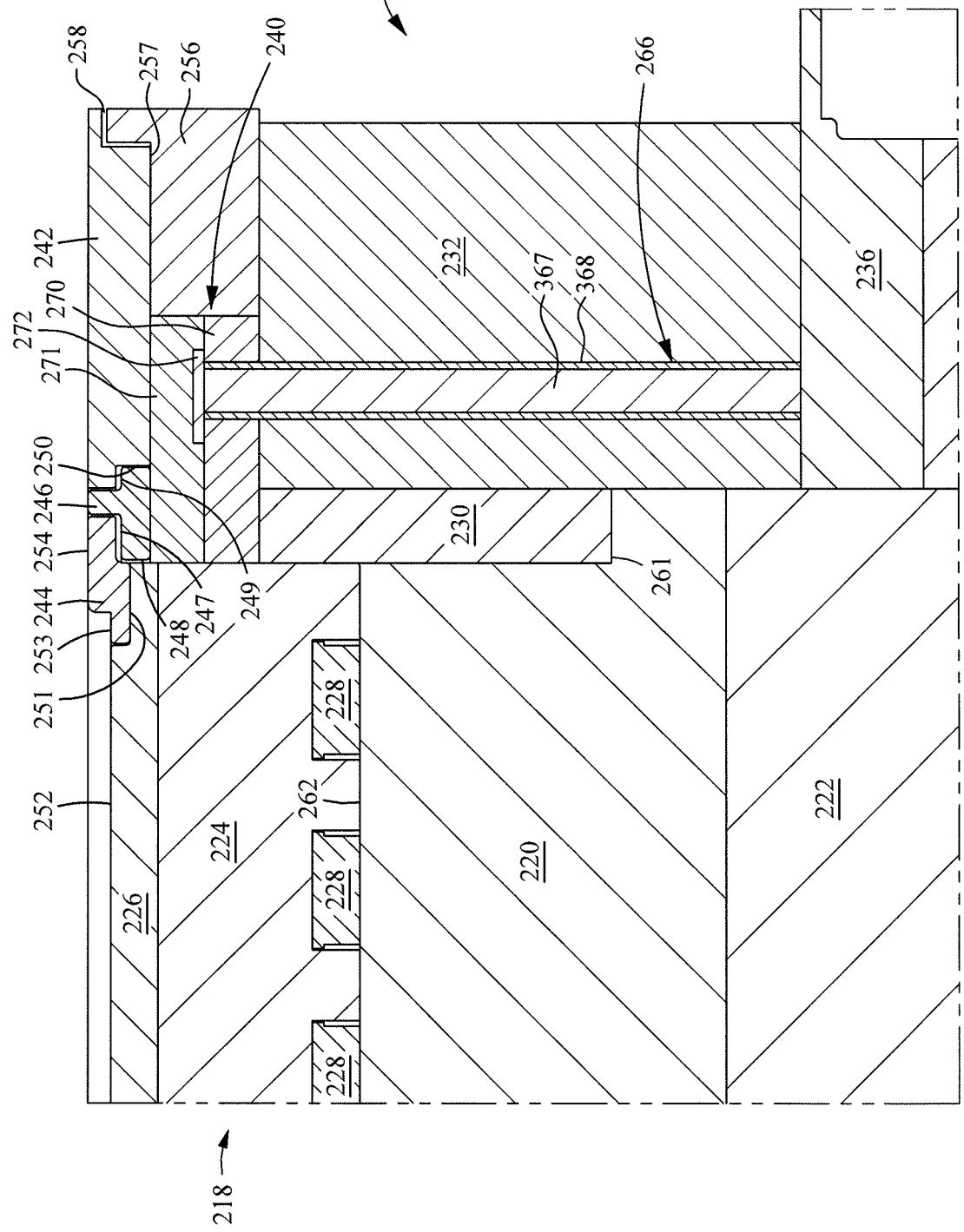

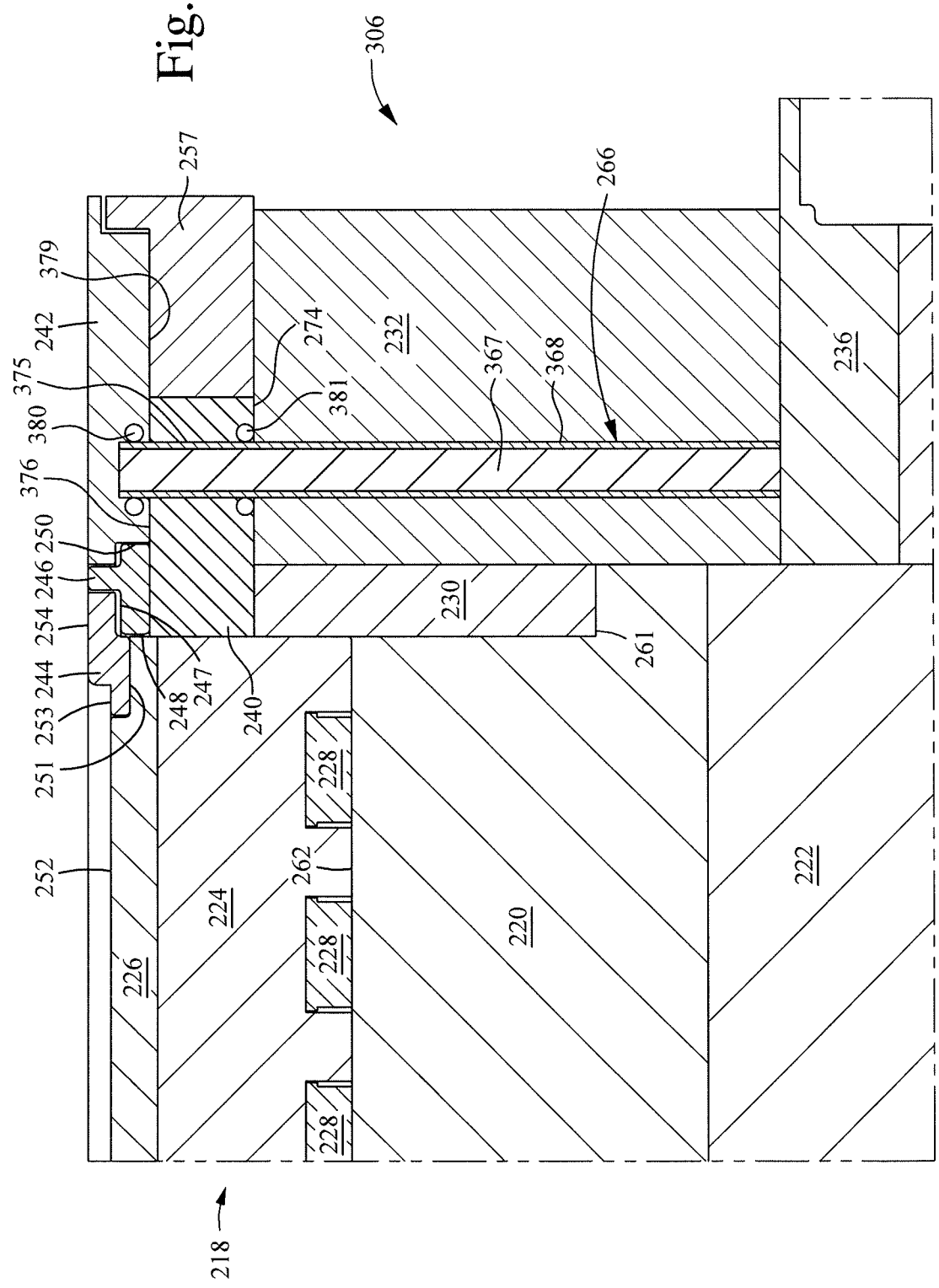

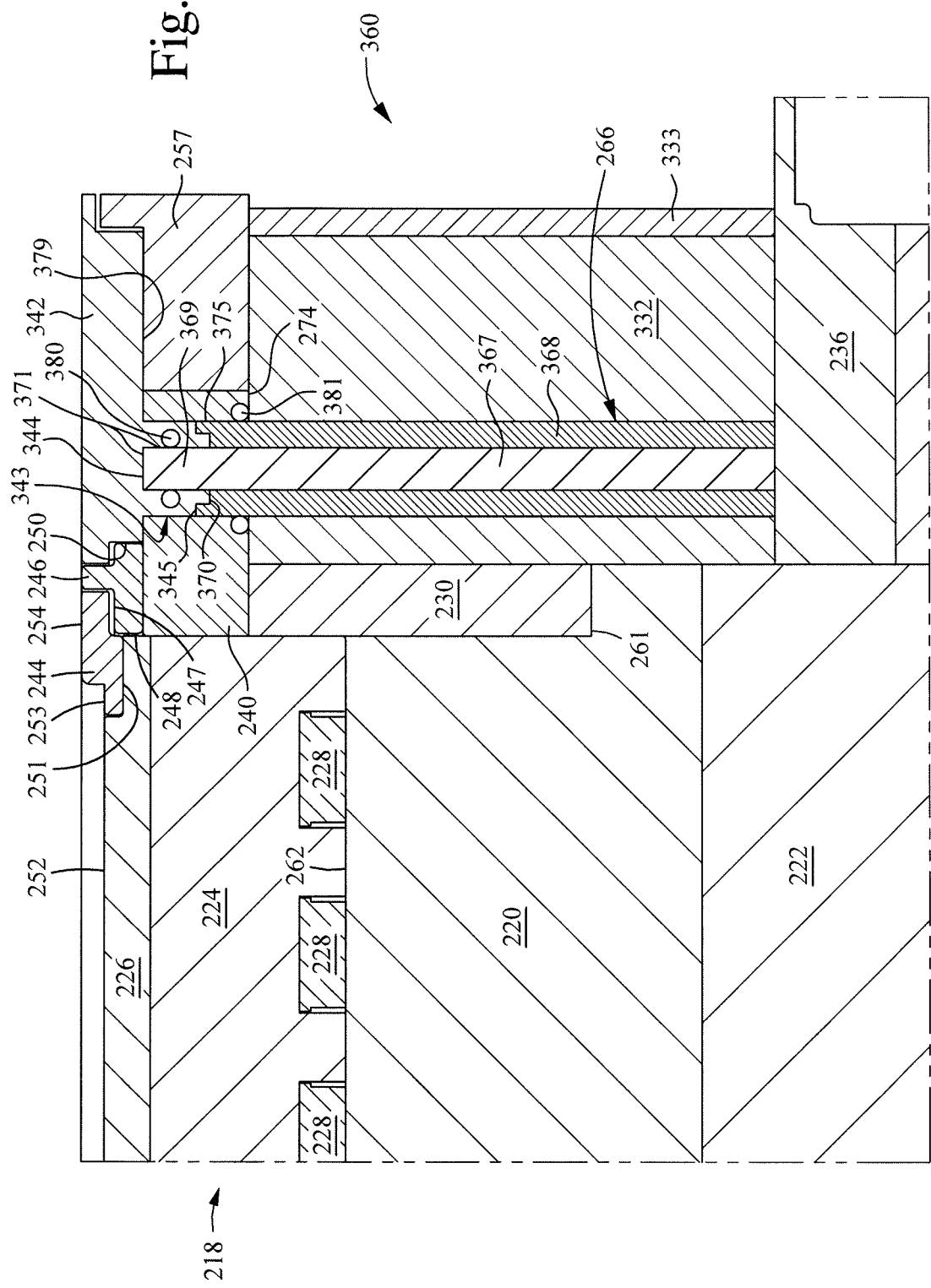

US 10,847,347 B2

EDGE RING ASSEMBLY FOR A SUBSTRATE SUPPORT IN A PLASMA PROCESSING CHAMBER

CROSS-REFERENCE TO RELATED APPLICATIONS

This application claims benefit of U.S. provisional patent application Ser. No. 62/722,000 filed Aug. 23, 2018, which is herein incorporated by reference.

BACKGROUND

Field

Aspects of the present disclosure generally relate to methods of and apparatuses for controlling a plasma sheath near a substrate edge.

Description of the Related Art

In the current semiconductor manufacturing industry, feature size continues to decrease and transistor structures become increasingly complicated. To meet processing demands, advanced processing control techniques are useful to control cost and maximize substrate and die yield. Normally, the dies at the edge of the substrate suffer yield issues such as contact via misalignment, and poor selectivity to a hard mask. One of the causes of these issues is the bending of a plasma sheath near the substrate edge.

Therefore, there is a need for methods and apparatus to allow fine, localized process tuning at the edge of the substrate.

SUMMARY

In one aspect, the present disclosure relates to a substrate support. The substrate support includes an electrostatic chuck with a chucking electrode; an edge ring assembly positioned exterior to the electrostatic chuck, the edge ring assembly including an edge ring electrode; an outer silicon ring positioned above the edge ring assembly; an inner silicon ring positioned above the edge ring assembly within the outer silicon ring; and an insulating ring positioned above the edge ring assembly between the outer silicon ring and the inner silicon ring.

In another aspect, the present disclosure relates to a processing chamber. The processing chamber includes a chamber body; and a substrate support positioned within the chamber body. The substrate support includes an electrostatic chuck including a chucking electrode; an edge ring assembly positioned exterior to the electrostatic chuck, the edge ring assembly including an edge ring electrode; an outer silicon ring positioned above the edge ring assembly; an inner silicon ring positioned above the edge ring assembly within the outer silicon ring; and an insulating ring positioned above the edge ring assembly between the outer silicon ring and the inner silicon ring.

In another aspect, the present disclosure relates to a method of processing substrates. The method includes processing a first substrate within a processing chamber including a substrate support using a plasma sheath, the substrate support including an edge ring assembly including an edge ring electrode; an outer silicon ring positioned above the edge ring assembly; an inner silicon ring positioned within the outer silicon ring; and an insulating ring positioned between the outer silicon ring and the inner silicon ring. The method further includes adjusting the plasma sheath within the processing chamber with the edge ring electrode; and processing a second substrate within the processing chamber using the adjusted plasma sheath.

In another aspect, the present disclosure relates to a substrate support. The substrate support includes an electrostatic chuck including a chucking electrode; an edge ring assembly positioned exterior to the electrostatic chuck, the edge ring assembly including an edge ring electrode; a silicon ring positioned above the edge ring assembly; and a power distribution assembly in direct electrical contact with the edge ring electrode.

In another aspect, the present disclosure relates to a processing chamber. The processing chamber includes a chamber body; and a substrate support positioned within the chamber body. The substrate support includes an electrostatic chuck with a chucking electrode; and an edge ring assembly positioned exterior to the electrostatic chuck, the edge ring assembly including an edge ring electrode. The processing chamber further includes a power distribution assembly in direct electrical contact with the edge ring electrode.

In another aspect, the present disclosure relates to a method of processing substrates. The method includes processing a first substrate within a processing chamber including a substrate support using a plasma sheath, the substrate support including an edge ring assembly with an edge ring electrode; and a power distribution assembly in direct electrical contact with the edge ring electrode. The method further includes adjusting the plasma sheath within the processing chamber with the edge ring electrode; and processing a second substrate within the processing chamber using the adjusted plasma sheath.

In another aspect, the present disclosure relates to a substrate support. The substrate support includes an electrostatic chuck with a chucking electrode; an edge ring assembly positioned exterior to the electrostatic chuck, the edge ring assembly including an edge ring electrode; a silicon ring positioned above the edge ring assembly; and a baffle ring with the edge ring assembly positioned above the baffle ring with the edge ring assembly clamped to the baffle ring.

In another aspect, the present disclosure relates to a processing chamber. The processing chamber includes a chamber body; and a substrate support positioned within the chamber body. The substrate support includes an electrostatic chuck including a chucking electrode; an edge ring assembly positioned exterior to the electrostatic chuck, the edge ring assembly including an edge ring electrode; and a baffle ring with the edge ring assembly positioned above the baffle ring with the edge ring assembly clamped to the baffle ring.

In another aspect, the present disclosure relates to a method of processing substrates. The method includes processing a first substrate within a processing chamber including a substrate support using a plasma sheath, in which the substrate support includes an edge ring assembly including an edge ring electrode; and a baffle ring with the edge ring assembly positioned above the baffle ring with the edge ring assembly clamped to the baffle ring. The method further includes adjusting the plasma sheath within the processing chamber with the edge ring electrode; and processing a second substrate within the processing chamber using the adjusted plasma sheath.

In another aspect, the present disclosure relates to a substrate support. The substrate support includes an electrostatic chuck with a chucking electrode; an edge ring assembly positioned exterior to the electrostatic chuck; a silicon ring positioned above the edge ring assembly; and a baffle ring with the edge ring assembly positioned above the baffle ring. The edge ring assembly includes a base with an inner recess formed within an inner surface of the base and an outer recess within an outer surface of the base; a cap positioned above the base with an inner lip positioned within the inner recess of the base and an outer lip positioned within the outer recess of the base; and an edge ring electrode positioned between the cap and the base.

In another aspect, the present disclosure relates to a processing chamber. The processing chamber includes a chamber body; and a substrate support positioned within the chamber body. The substrate support includes an electrostatic chuck including a chucking electrode; and an edge ring assembly positioned exterior to the electrostatic chuck. The edge ring assembly includes a base including an inner recess formed within an inner surface of the base and an outer recess within an outer surface of the base; a cap positioned above the base and including an inner lip positioned within the inner recess of the base and an outer lip positioned within the outer recess of the base; and an edge ring electrode positioned between the cap and the base.

In another aspect, the present disclosure relates to an edge ring assembly. The edge ring assembly includes a base including an inner recess formed within an inner surface of the base and an outer recess within an outer surface of the base; a cap positioned above the base and including an inner lip positioned within the inner recess of the base and an outer lip positioned within the outer recess of the base; and an edge ring electrode positioned between the cap and the base In another aspect, the present disclosure relates to a processing chamber. The processing chamber includes a chamber body; a substrate support positioned within the chamber body; an upper plasma screen positioned about the substrate support within the chamber body and including an opening formed therethrough; and a lower plasma screen positioned about the substrate support below the upper plasma screen within the chamber body and including an opening formed therethrough. The opening of the upper plasma screen is rotationally offset from the opening of the lower plasma screen, such as with respect to an axis of the substrate support. Further, a line of sight from above the substrate support is obstructed or prevented through the opening of the upper plasma screen and the opening of the lower plasma screen.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of scope, as the disclosure may admit to other equally effective aspects.

FIG. 2 is a schematic sectional view of a substrate support, according to one aspect of the disclosure.

FIG. 3A is a schematic sectional view of a substrate support, according to one aspect of the disclosure.

FIG. 3B is a schematic sectional view of a substrate support, according to one aspect of the disclosure.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

The present disclosure generally relates to apparatuses and methods for controlling a plasma sheath near a substrate edge. The apparatus relates to a processing chamber and/or a substrate support that includes an edge ring assembly with an edge ring electrode and an electrostatic chuck with a chucking electrode. The edge ring assembly is positioned adjacent the electrostatic chuck, such as with the edge ring assembly positioned exterior to or about the electrostatic chuck. The edge ring assembly includes a base and a cap positioned above the base with the edge ring electrode positioned between the cap and the base. The base of the edge ring electrode may include an inner recess and/or an outer recess with the cap including one or more lips that extend into the inner recess and/or the outer recess. One or more silicon rings and/or insulating rings are positioned adjacent the edge ring assembly. Further, a power distribution assembly is used to provide electric power to the edge ring assembly, such as by being in direct electrical contact with the edge ring electrode and/or the silicon ring. Methods of using the same are also provided.

Figure 1:
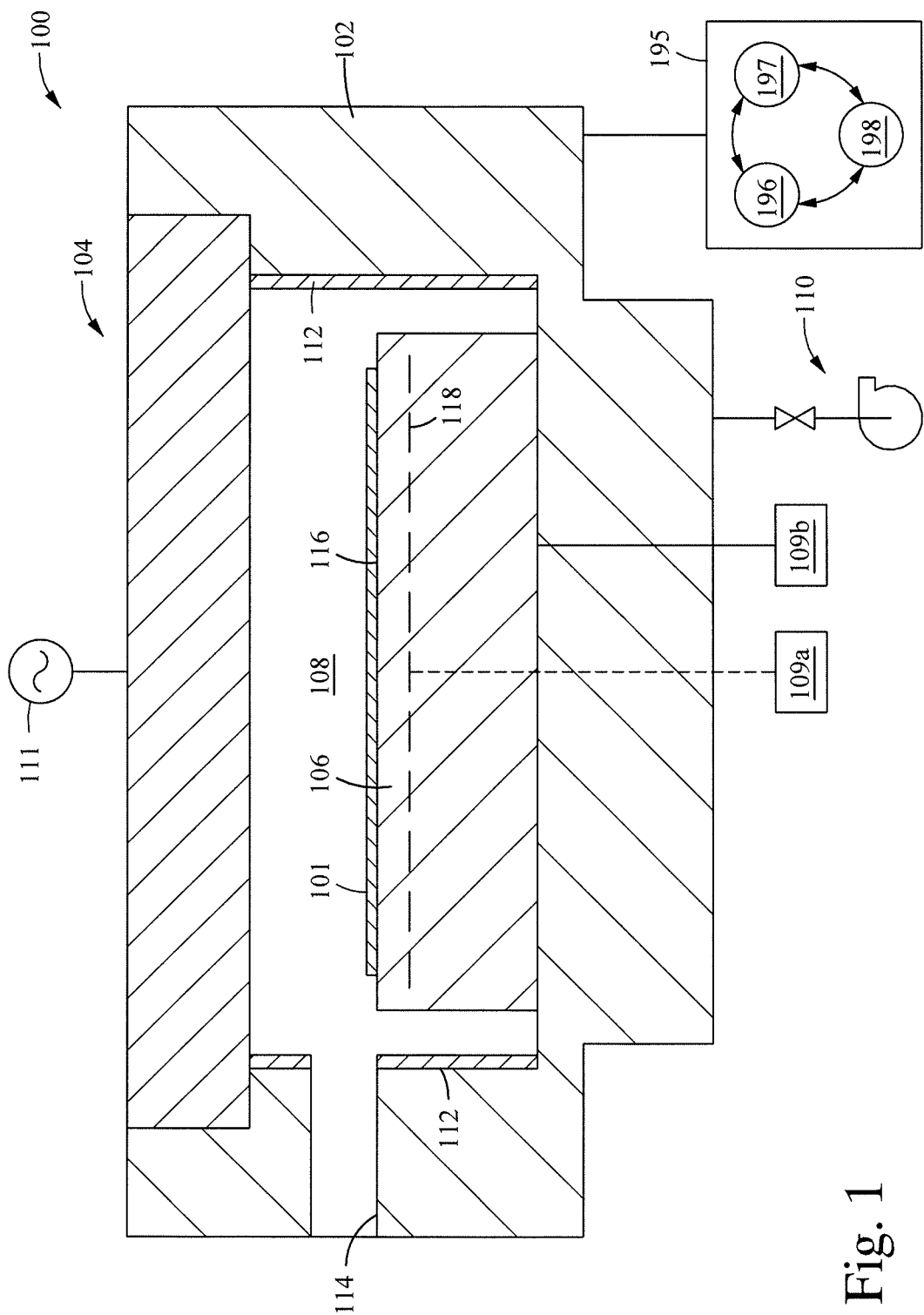
FIG. 1 is a cross sectional view of a processing chamber, according to one aspect of the disclosure.

FIG. 1 is a cross sectional view of a processing chamber 100, according to one aspect of the disclosure. As shown, the processing chamber 100 is an etch chamber suitable for etching a substrate, such as substrate 101. Examples of processing chambers which benefit from aspects described herein are available from Applied Materials, Inc., located in Santa Clara, Calif. It is contemplated that other processing chambers, including those from other manufacturers, may be adapted to benefit from aspects of the disclosure.

In one example, the processing chamber 100 includes a chamber body 102, a gas distribution plate assembly 104, and a substrate support 106. The chamber body 102 of the processing chamber 100 includes or may be formed from one or more process-compatible materials, such as aluminum, anodized aluminum, nickel plated aluminum, nickel plated aluminum 6061-T6, stainless steel, as well as combinations and alloys thereof, for example. The substrate support 106 functions as an electrode in conjunction with the gas distribution plate assembly 104. As such, a plasma may be formed in a processing volume 108 defined between the gas distribution plate assembly 104 and an upper surface of the substrate support 106. As discussed more below, the substrate support 106 includes or is formed of a conductive material, such as aluminum, a ceramic material, or a combination of both. The chamber body 102 also is coupled to a vacuum system 110 that includes a pump and a valve, and a liner 112 may be disposed on surfaces of the chamber body 102 in the processing volume 108.

The chamber body 102 includes a port 114 formed in a sidewall thereof. The port 114 is selectively opened and closed to allow access to the interior of the chamber body 102 by a substrate handling robot (not shown). In such an example, a substrate 101 is transferred in and out of the processing chamber 100 through the port 114. The substrate 101 is positioned on the upper surface 116 of the substrate support 106 for processing. Lift pins (not shown) may be used to space the substrate 101 away from the upper surface of the substrate support 106, such as to enable exchange with the substrate handling robot during substrate transfer.

The gas distribution plate assembly 104 is positioned on the chamber body 102. A power source 111, such as a radio frequency (RF) power source, is coupled to distribution plate assembly 104 to electrically bias the gas distribution plate assembly 104 relative to the substrate support 106 to facilitate plasma generation within the processing chamber 100. The substrate support 106 includes an electrostatic chuck 118, in which the electrostatic chuck 118 may be connected to a power source 109a to facilitate chucking of the substrate 101 and/or to influence a plasma located within the processing region 108. The power source 109a includes a power supply, such as a DC or RF power supply, and is connected to one or more electrodes of the electrostatic chuck 118. A bias source 109b may additionally or alternatively be coupled with the substrate support 106 to assist with plasma generation and/or control, such as to an edge ring assembly discussed more below.

The bias source 109b may illustratively be a source of up to about 1000 W (but not limited to about 1000 W) of RF energy at a frequency of, for example, approximately 13.56 MHz, although other frequencies and powers may be provided as desired for particular applications. The bias source 109b is capable of producing either or both of continuous or pulsed power. In some aspects, the bias source may be capable of providing multiple frequencies, such as 13.56 MHz and 2 MHz.

The processing chamber 100 may also include a controller 195. The controller 195 includes a programmable central processing unit (CPU) 196 that is operable with a memory 197 and a mass storage device, an input control unit, and a display unit (not shown), such as power supplies, clocks, cache, input/output (I/O) circuits, and the liner, coupled to the various components of the processing system to facilitate control of the substrate processing.

To facilitate control of the processing chamber 100 described above, the CPU 196 may be one of any form of general purpose computer processor that can be used in an industrial setting, such as a programmable logic controller (PLC), for controlling various chambers and sub-processors. The memory 197 is coupled to the CPU 196 and the memory 197 is non-transitory and may be one or more of random access memory (RAM), read only memory (ROM), floppy disk drive, hard disk, or any other form of digital storage, local or remote. Support circuits 198 are coupled to the CPU 196 for supporting the processor. Applications or programs for charged species generation, heating, and other processes are generally stored in the memory 197, typically as software routine. The software routine may also be stored and/or executed by a second CPU (not shown) that is remotely located from the processing chamber 100 being controlled by the CPU 196.

The memory 197 is in the form of computer-readable storage media that contains instructions, when executed by the CPU 196, to facilitate the operation of the processing chamber 100. The instructions in the memory 197 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are aspects of the present disclosure.

FIG. 2 is a schematic sectional view of a substrate support 206, according to one aspect of the disclosure. The substrate support 206 is similar to, and may be used in place of, the substrate support 106. The substrate support 206 includes an electrostatic chuck 218, a dielectric plate 220, and a facilities plate 222 arranged in a vertical stack, in which the dielectric plate 220 is positioned above the facilities plate 222 and the electrostatic chuck 218 is positioned above the dielectric plate 220. The electrostatic chuck 218 includes a conductive plate 224 with a ceramic plate 226 positioned on top of the conductive plate 224. The ceramic plate 226 may include or be formed from a ceramic, such as silicon carbide or alumina. One or more electrodes 228, such as formed from a thin section of conductive material, are embedded in a ceramic or dielectric material of the conductive plate 224. A high voltage DC source may be coupled to the electrodes 228 to facilitate chucking of a substrate, and a bias RF source may be coupled to the conductive plate 224 through a matching network to power a cathode. The facilities plate 222 may include or be formed from an electrically conducting material and may have one or more channels extending therethrough for fluid flow to facilitate temperature control of the substrate support 206. Further, the dielectric plate 220 may include or be formed from quartz.

The substrate support 206 may further include a pipe ring 230, a baffle ring 232, and/or a mesh flow equalizer 236. The pipe ring 230 may include or be formed from quartz, and is positioned about the electrostatic chuck 218 and about or within the dielectric plate 220. The pipe ring 230 facilitates insulation of the electrostatic chuck 218. The baffle ring 232 is positioned about the pipe ring 230. The baffle ring 232 may include or be formed from metal, such as aluminum, and may be electrically grounded. The mesh flow equalizer 236 is positioned about the facilities plate 222 and below the baffle ring 232 with the mesh flow equalizer 236 extending radially outward, such as radially outward with respect to the outer surface of the baffle ring 232. The mesh flow equalizer 236 may include or be formed from metal, such as aluminum, and may also be grounded.

In one example, a heater may be included within one or more components of the substrate support 206. For example, a heater may be included within the electrostatic chuck 218 to facilitate temperature control of the substrate. The heater may be positioned between the conductive plate 224 with the ceramic plate 226. The baffle ring 232 may additionally or alternatively include a heater. The heater may be, for example, a resistive heater, including one or more resistive heating elements.

Referring still to FIG. 2, the substrate support 206 includes an edge ring assembly 240. The edge ring assembly 240 is positioned exterior to or about the electrostatic chuck 218 and includes a base 270 with a cap 271 positioned above the base 270. An electrode 272 is positioned between the base 270 and the cap 271. The base 270 and/or the cap 271 include or are formed from ceramic, and the electrode 272 includes or is formed from an electrically conductive material, such as metal. For example, the electrode 272 may be an electrically conductive wire or flattened ring, such as a foil. In one example, the electrode 272 may include or be formed from aluminum or copper. Further, the electrode 272 may be a flattened ring having a thickness of about 0.2 inches to about 0.4 inches.

Further, the substrate support 206 includes one or more silicon rings and one or more insulating rings, such as to facilitate coupling of a plasma (not shown) that is generated in the interior volume 108 above the substrate support 206 to the edge ring assembly 240. As shown in FIG. 2, the substrate support 206 includes an outer silicon ring 242 and an inner silicon ring 244, which each may include or be formed from silicon, such as mono-crystalline silicon or polysilicon. The outer silicon ring 242 and the inner silicon ring 244 are both positioned above the edge ring assembly 240 with the inner silicon ring 244 positioned within the outer silicon ring 242. Further, an insulating ring 246 is also positioned above the edge ring assembly 240 and between the outer silicon ring 242 and the inner silicon ring 244. The insulating ring 246 is shown as fully extending between the outer silicon ring 242 and the inner silicon ring 244 to prevent any contact between the outer silicon ring 242 and the inner silicon ring 244. Thus, the outer silicon ring 242 is positioned exterior to the insulating ring 246 to encircle the insulating ring 246, and the insulating ring 246 is positioned exterior to the inner silicon ring 244 to encircle the inner silicon ring 244.

One or more components of the substrate support 206 may include one or more recesses formed therein to facilitate arrangement, insulation, and conductivity amongst the components within the substrate support 206. For example, the insulating ring 246 may include one or more recesses to facilitate arrangement and insulation between the outer silicon ring 242 and the inner silicon ring 244. As shown in FIG. 2, the insulating ring 246 includes an inner recess 247 formed within an inner surface 248 of the insulating ring 246, and includes an outer recess 249 formed within an outer surface 250 of the insulating ring 246. The inner silicon ring 244 is positioned within the inner recess 247 of the insulating ring 246, and the outer silicon ring 242 is positioned within the outer recess 249 of the insulating ring 246.

Further, the electrostatic chuck 218 and/or the inner silicon ring 244 may include one or more recesses to facilitate arrangement and conductivity between the inner silicon ring 244 and the electrostatic chuck 218. For example, the ceramic plate 226 positioned above the conductive plate 224 within the electrostatic chuck 218 includes an upper recess 251 formed within an upper surface 252 of the ceramic plate 226. The inner silicon ring 244 is positioned within the upper recess 251 of the ceramic plate 226. Further, the inner silicon ring 244 includes an upper recess 253 formed within an upper surface 254 of the inner silicon ring 244. The upper recess 251 and the upper surface 252 of the ceramic plate 226, along with the upper recess 253 of the inner silicon ring 244, are formed such that the upper surface 252 of the ceramic plate 226 and the upper recess 253 of the inner silicon ring 244 are co-planar or level with each other. This may facilitate support for a substrate positioned on the substrate support 206, such as for electrostatic chucking.

As mentioned above, the substrate support 206 may include one or more insulating rings. Thus, an outer insulating ring 256 is included within the substrate support 206 in addition to the (inner) insulating ring 246. The outer insulating ring 256 is positioned above the baffle ring 232 and exterior to the edge ring assembly 240 to encircle the edge ring assembly 240. The outer silicon ring 242 is positioned above the outer insulating ring 256, in which the outer insulating ring 256 may include one or more recesses between the outer silicon ring 242 and the outer insulating ring 256 to facilitate arrangement and insulation within the substrate support 206. For example, as shown, the outer insulating ring 256 includes an upper recess 257 formed within an upper surface 258 of the outer insulating ring 256 with the outer silicon ring 242 positioned within the upper recess 257 of the outer insulating ring 256. The insulating ring 246 and the outer insulating ring 256 may include or be formed from the same insulating material, such as quartz.

Referring still to FIG. 2, in addition to those discussed above, one or more recesses may be formed in one or more other components of the substrate support 206. For example, the dielectric plate 220 includes an upper recess 261 formed within an upper surface 262 of the dielectric plate 220 with the pipe ring 230 positioned within the upper recess 261 of the dielectric plate 220. Accordingly, the present disclosure contemplates other embodiments and structures for the components of a substrate support in addition or in alternative to those disclosed above.

Power is supplied to the edge ring assembly 240 through a power distribution assembly 266. The power distribution assembly 266 is shown in FIG. 2 as positioned within the baffle ring 232 and is in direct electrical contact with the edge ring assembly 240. In particular, the power distribution assembly 266 includes one or more components, such as a pin 367 positioned within an outer sleeve 368. The pin 367 is then in direct electrical contact with the edge ring assembly 240, or more specifically the edge ring electrode 272 of the edge ring assembly 240. In one example, the power distribution assembly 266 may be coupled to an adjustable RF source (for example, bias source 109b) to transfer power to the edge ring assembly 240. In one example, the power distribution assembly 266 may be coupled to an external RF impedance tuning unit, or tunable load. In such an example, the tuning unit may be 1) used to adjust impedance at SRC RF frequency to vary plasma density distribution, 2) used to adjust impedance at bias RF frequency to tune substrate edge plasma sheath, and/or 3) coupled to ground and to locate ground closer to the substrate edge.

Thus, with reference to FIGS. 1 and 2 collectively, a plasma is generated in the processing chamber 100 by the power source 111. The power source 109a may be coupled to the electrostatic chuck 218 to facilitate chucking of a substrate and/or to influence the plasma located within the processing region 108 of the processing chamber 100. Further, the bias source 109b may be coupled to the edge ring assembly 240 through the power distribution assembly 266 to facilitate plasma processing within the processing chamber 100. One or more circuits may be coupled to the edge ring assembly 240 to affect the electrical properties of the edge ring electrode 272 included within the edge ring assembly 240, thereby influencing the plasma, or a sheath of the plasma, adjacent a substrate. The plasma may be adjusted to result in more uniform processing of a substrate, thereby mitigating substrate edge non-uniformities.

The gas distribution plate assembly 104 is positioned on the chamber body 102. A power source 111, such as a radio frequency (RF) power source, is coupled to distribution plate assembly 104 to electrically bias the gas distribution plate assembly 104 relative to the substrate support 106 to facilitate plasma generation within the processing chamber 100. The substrate support 106 includes an electrostatic chuck 118, in which the electrostatic chuck 118 may be connected to a power source 109a to facilitate chucking of the substrate 101 and/or to influence a plasma located within the processing region 108. The power source 109a includes a power supply, such as a DC or RF power supply, and is connected to one or more electrodes of the electrostatic chuck 118. A bias source 109b may additionally or alternatively be coupled with the substrate support 106 to assist with plasma generation and/or control, such as to an edge ring assembly discussed more below.

In the above and below discussion and example, the components of a processing chamber and a substrate support are generally defined and described as having a circular, and more specifically a cylindrical, shape. However, the present disclosure is not so limited, as other shapes are also contemplated for one or more components of the processing chamber and the substrate support without departing from the scope of the present disclosure. For example, in an example in which rectangular substrates are formed within a processing chamber, the substrate support may correspondingly have one or more rectangular components.

FIG. 3A is a schematic sectional view of a substrate support 306, according to one aspect of the disclosure. The substrate support 306 includes a power distribution assembly 266 positioned in the baffle ring 232. The power distribution assembly 266 is in direct electrical contact with the edge ring assembly 240, and more specifically in direct electrical contact with the edge ring electrode 272 positioned within the edge ring assembly 240. Further, the power distribution assembly 266 is in direct electrical contact with the outer silicon ring 242 through the edge ring assembly 240. Thus, the power distribution assembly 266 is not capacitively coupled with the edge ring assembly 240 and/or the outer silicon ring 242 to provide power, as the power distribution assembly 266 is able to provide power through the direct electrical contact with the edge ring assembly 240 and/or the outer silicon ring 242.

As shown in FIG. 3A, the edge ring assembly 240 includes a recess 375 formed within a lower surface 274 of the edge ring assembly 240, in which the recess 375 may extend through an upper surface 376 of the edge ring assembly 240. The pin 367, which includes or is formed from an electrically conductive material, such as metal, is positioned within the recess 375 of the edge ring assembly 240. In such an example, the pin 367 may directly electrically contact the edge ring electrode 272 to provide power from the power distribution assembly 266 to the edge ring assembly 240.

Further, the pin 367 may extend through the upper surface 376 of the edge ring assembly 240 to directly electrically contact the outer silicon ring 242. In such an example, the outer silicon ring 242 may include a recess formed within a lower surface 379 of the outer silicon ring 242, in which the pin 367 extends into to be positioned within the recess of the outer silicon ring 242. An electrical contact, such as a spring contact 380, may be positioned within the recess of the outer silicon ring 242 to receive the pin 367 and facilitate the direct electrical contact between the pin 367 and the outer silicon ring 242. The spring contact 380 may, for example, be an RF gasket or an electrical contact provided by Bal Seal® of Foothill Ranch, Calif., USA.

One or more seals, such as a gasket or an o-ring, are positioned adjacent the pin 367 within the recess 375 of the edge ring assembly 240. For example, an o-ring 381 is within the recess 375 of the edge ring assembly 240 and about the pin 367 of the power distribution assembly 266.

As shown in FIGS. 3A and 3B, the power distribution assembly 266 includes the pin 367 and the outer sleeve 368 with the pin 367 positioned within the outer sleeve 368. In this example, when the power distribution assembly 266 is in direct electrical contact with the edge ring assembly 240, the pin 367 is directly contacting one or more components of the edge ring assembly 240. However, the present disclosure is not so limited, as the power distribution assembly 266 may include one or more other components in direct electrical contact with the edge ring assembly 240. For example, a socket, an electrical contact, and/or another component may be electrically coupled to the pin 367 and in direct electrical contact with the edge ring assembly 240.

A substrate support in accordance with the present disclosure may have one or more components bonded to each other to facilitate assembly of the substrate support. Further, a substrate support in accordance with the present disclosure may have one or more components clamped to each other to facilitate engagement of the components and/or assembly of the substrate support. Clamping of the components may also facilitate disassembly and replacement, such as to repair or replace one or more components within the substrate support and not the entirety of the substrate support.

FIG. 3B is a schematic sectional view of a substrate support 360, according to one aspect of the disclosure. The substrate support 360 is similar to the substrate support 306 described above, and includes one or more of the aspects, components, features, and/or properties thereof. As shown in FIG. 3B, the substrate support 360 includes an outer silicon ring 342 positioned outside of the inner silicon ring 244 and the insulating ring 246. The outer silicon ring 342 is similar to the outer silicon ring 242 described above, and includes one or more of the aspects, components, features, and/or properties thereof. The outer silicon ring 342 includes one or more protrusions 343 that protrude from the lower surface 379 of the outer silicon ring 342 and into the recess 375 of the edge ring assembly 240. The one or more protrusions 343 may be disposed equidistantly circumferentially about the outer silicon ring 342. As an example, the protrusions 343 may be positioned at every 90 degrees about the outer silicon ring 342 (e.g., at 0 degrees, 90 degrees, 180 degrees, and 270 degrees about the outer silicon ring 342). A corresponding opening recess 375 may be positioned in the edge ring assembly 240 for each respective protrusion 343 to be disposed within. In one example, the outer silicon ring 342 includes four protrusions 343 protruding from the lower surface 379 and the edge ring assembly 240 includes four corresponding recesses 375. The four protrusions 343 are disposed at every 90 degrees about the substrate support 360 and the recesses 375 are disposed at every 90 degrees about the edge ring assembly 240.

The one or more protrusions 343 of the outer silicon ring 342 contact at least part of the power distribution assembly 266, such as pin 367. Each of the one or more protrusions 343 includes a cavity 344 that receives at least a portion of the power distribution assembly 266, such as a portion of the pin 367, and/or at least a portion of an electrical contact (described below). In one example, an upper portion 369 of the pin 367 is disposed within the cavity 344 of the protrusion 343. The pin 367 contacts one or more inner faces 371 (two are illustrated in FIG. 3B) of the protrusion 343. The one or more inner faces 371 are defined by the cavity 344.

An electrical contact, such as a spring contact 380, may be positioned in between and/or in contact with the pin 367 and the protrusion 343 to facilitate the direct electrical contact between the pin 367 and the outer silicon ring 342, such as the protrusion 343 of the outer silicon ring 342. In one example, the electrical contact, such as a spring contact 380, is positioned within the cavity 344 of the protrusion 343 to receive the pin 367. The spring contact 380 may, for example, be an RF gasket or an electrical contact provided by Bal Seal® of Foothill Ranch, Calif., USA.

Each protrusion 343 includes a shoulder 345 in a lower end of the protrusion 343. The outer sleeve 368 of the power distribution assembly 266 includes a shoulder 370 in an upper end of the outer sleeve 368. In one example, each protrusion 343 is in contact with the respective outer sleeve 368. In one example, the upper end of the outer sleeve 368 interfaces with, and/or contacts, the shoulder 345 of the protrusion 343; and the lower end of the protrusion 343 interfaces with, and/or contacts, the shoulder 370 of the outer sleeve 368. In one example, an upper end of the pin 367 is disposed to be coplanar with, or below, the lower surface 379 of the outer silicon ring 342.

The power distribution assembly 266 is in direct electrical contact with the edge ring assembly 240, and more specifically in direct electrical contact with the edge ring electrode 272 positioned within the edge ring assembly 240. The power distribution assembly 266 is in direct electrical contact with the outer silicon ring 342 through the edge ring assembly 240. Thus, the power distribution assembly 266 is not capacitively coupled with the edge ring assembly 240 and/or the outer silicon ring 342 to provide power, as the power distribution assembly 266 is able to provide power through the direct electrical contact with the edge ring assembly 240 and/or the outer silicon ring 342.

The substrate support 260 includes a baffle ring 332. The baffle ring 332 is similar to the baffle ring 232 described above and below, and includes one or more of the aspects, components, features, and/or properties thereof. In one example, the baffle ring 332 includes or is formed from metal, such as aluminum, and is electrically grounded. In one example, the baffle ring 332 includes or is formed from a ceramic material, such as $Al_2O_3$, and a grounded liner 333 is disposed about the baffle ring 332 to encircle the baffle ring 332. The grounded liner 333 is electrically grounded and includes or is formed from a metal such as aluminum.

Aspects of the substrate support 360, such as protrusions 343 of the outer silicon ring 342, facilitate adjusting and/or controlling a plasma sheath and reducing or eliminating arcing of components of the substrate support 360. As an example, aspects of the substrate support 360 reduce arcing in a direction towards ground. For example, the protrusions 343, baffle ring 332, and/or grounded liner 333 reduce arcing in a direction towards ground. Aspects of the baffle ring 332 and/or grounded liner 333 can also move ground farther from the inner silicon ring 244 to reduce capacitive discharge.

Figure 4:
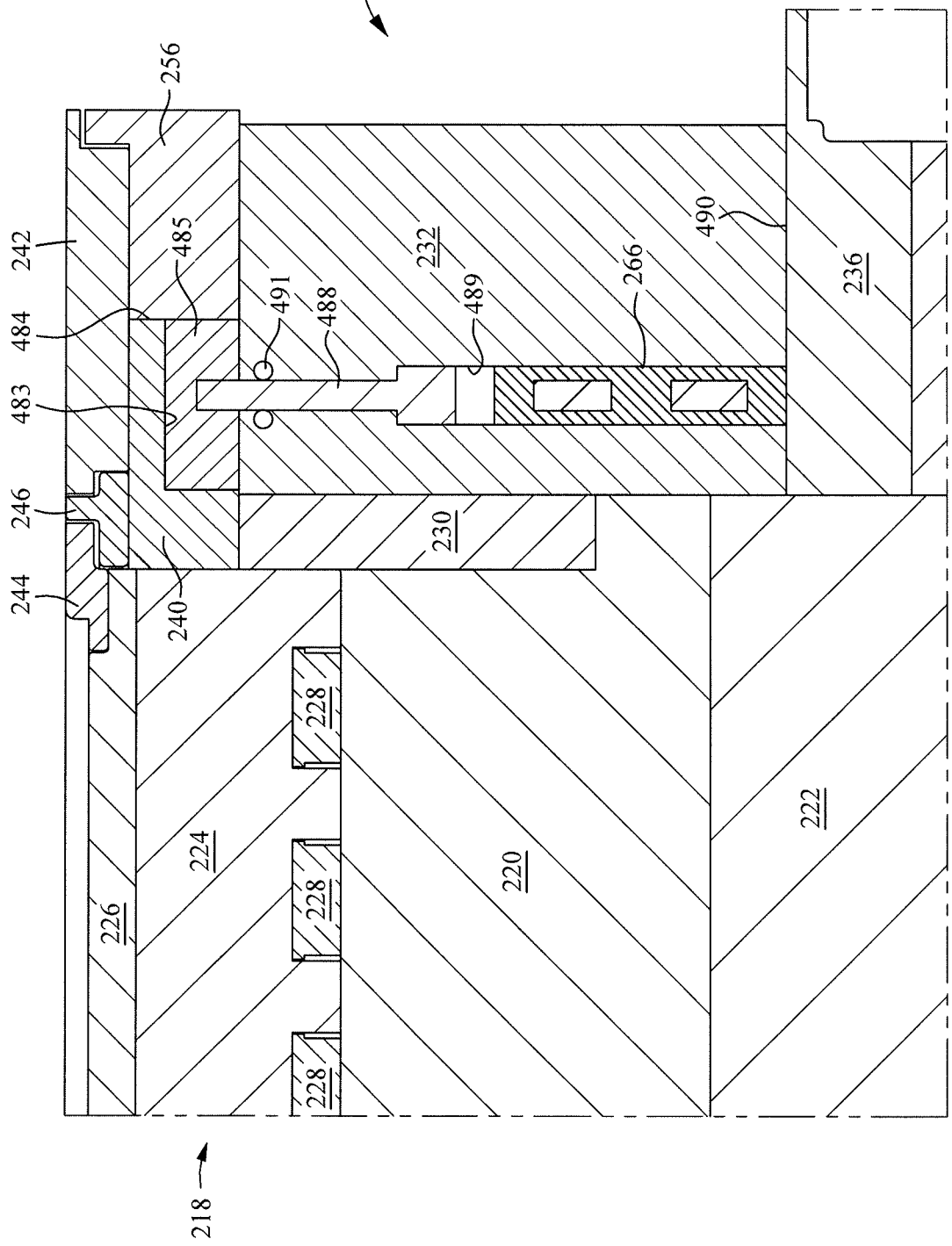
FIG. 4 is a schematic sectional view of a substrate support, according to one aspect of the disclosure.
Figure 5:
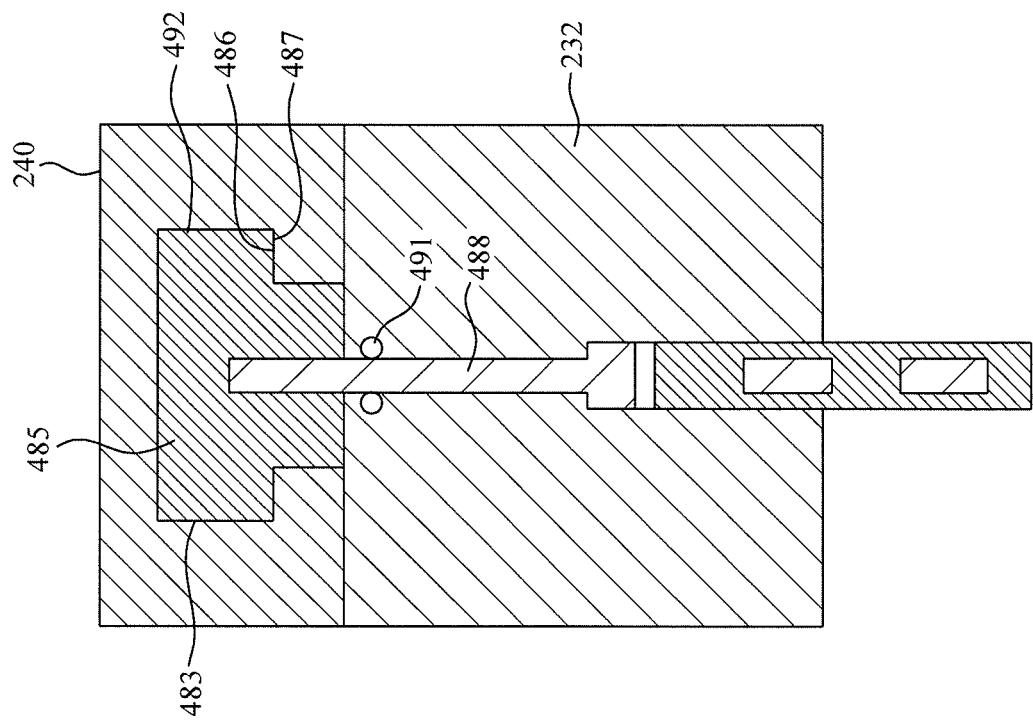
FIG. 5 is a schematic sectional view of an edge ring assembly including a fastening insert, according to one aspect of the disclosure.

FIGS. 4 and 5 are schematic sectional views of a substrate support 406, according to one aspect of the disclosure. As shown, the substrate support 406 includes the edge ring assembly 240 and the baffle ring 232 with the edge ring assembly 240 clamped to the baffle ring 232. The edge ring assembly 240 and the baffle ring 232 are clamped to each other to eliminate gaps therebetween, but also to enable the edge ring assembly 240 and the baffle ring 232 to be removable with respect to each other within the substrate support 406, such as to repair or replace the edge ring assembly 240 and/or the baffle ring 232.

In this example, to clamp the edge ring assembly 240 to the baffle ring 232, the edge ring assembly 240 includes a fastening insert recess 483 formed within an outer surface 484 and/or the lower surface 274 of the edge ring assembly 240. A fastening insert 485, which includes or may be formed from a polymer, such as plastic, is positioned within the fastening insert recess 483 of the edge ring assembly 240 to engage the edge ring assembly 240. In particular, a shoulder 486 of the fastening insert 485 engages a shoulder 487 of the edge ring assembly 240 in the fastening insert recess 483. Further, the outer insulating ring 256 is positioned exterior to the edge ring assembly 240 with the fastening insert 485 positioned between the insulating ring 256 and the edge ring assembly 240.

A fastener 488, such as a bolt, is used to couple with the fastening insert 485 to clamp the edge ring assembly 240 to the baffle ring 232. For example, a fastener recess 489 is formed within the baffle ring 232, such as within or through a lower surface 490 of the baffle ring 232. The fastener 488 is positioned within the fastener recess 489 to couple to the fastening insert 485. In one example, the fastener 488 may threadedly couple or engage with the fastening insert 485. Further, a seal 491 may be positioned about the fastener 488 to facilitate sealing with respect to the fastener 488.

As shown best in FIG. 5, the shoulder 486 of the fastening insert 485 may extend from or be formed within a side surface 492 of the fastening insert 485 to engage the corresponding shoulder 487 of the edge ring assembly 240. In such an example, the fastening insert 485 may have a t-slot engagement with the edge ring assembly 240. However, one or more arrangements are contemplated for clamping the edge ring assembly 240 to the baffle ring 232 in accordance with the present disclosure than those specifically disclosed above, including different shoulder engagements or positioning the fastening insert 485 within the baffle ring 232, as opposed to the edge ring assembly 240, as shown.

Figure 6:
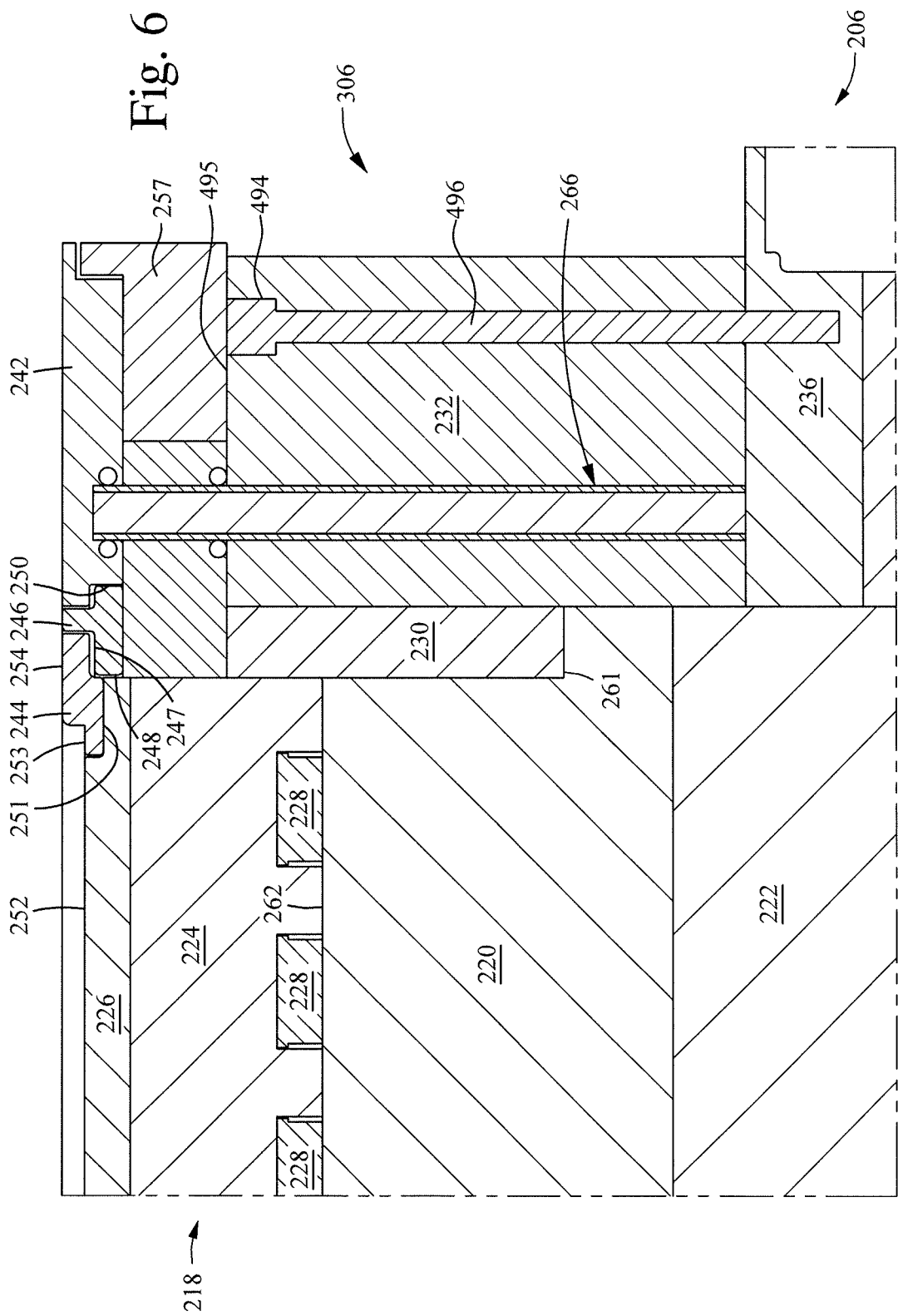
FIG. 6 is a schematic sectional view of a substrate support, according to one aspect of the disclosure.

In one example, the baffle ring 232 may be clamped to the mesh flow equalizer 236. For example, as shown in FIG. 6, a fastener recess 494 is formed in an upper surface 495 of the baffle ring 232. A fastener 496 is positioned within the fastener recess 494 of the baffle ring 232 to then clamp the baffle ring 232 to the mesh flow equalizer 236. In such an example, the fastener 496 may threadedly engage with the mesh flow equalizer 236.

Figure 7:
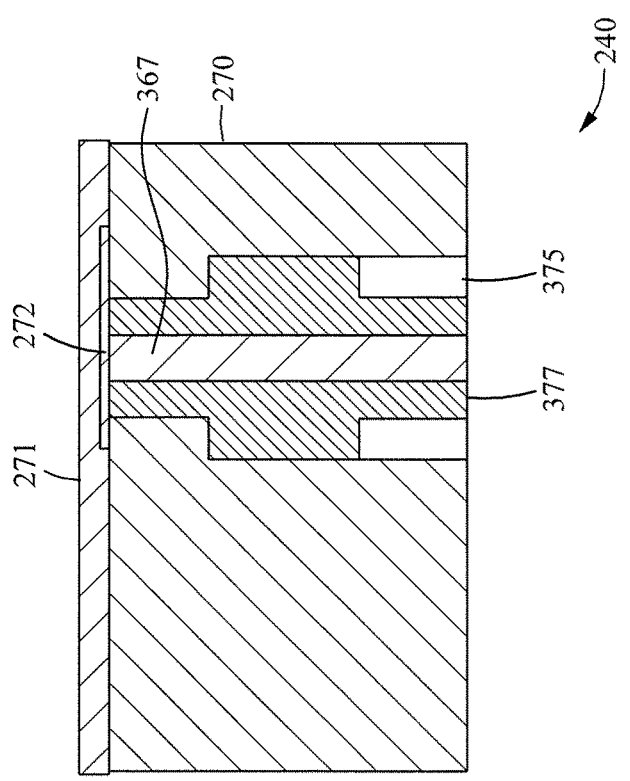
FIG. 7 is a schematic sectional view of an edge ring assembly, according to one aspect of the disclosure.

FIG. 7 is a schematic sectional view of an edge ring assembly 240, according to one aspect of the disclosure. As discussed above, the edge ring assembly 240 includes the base 270, the cap 271 positioned above the base 270, and the edge ring electrode 272 positioned between the base 270 and the cap 271. Further, the edge ring assembly 240 includes one or more recesses 375, such as a socket recess to receive a socket 377. In this example, the socket 377 makes direct electrical contact with the edge ring electrode 272, but the socket 377 does not extend through the edge ring assembly 240, such as through the cap 271 of the edge ring assembly 240. Further, the pin 367 is received within the socket 377 such that the edge ring electrode 272 is electrically coupled to the pin 367 through the socket 377.

An edge ring assembly 240 in accordance with the present disclosure may include one or more recesses 375, such as one or more socket recesses and one or more fastening insert recesses 483, each discussed above. In such an example, the socket recesses 375 and the fastening insert recesses 483 may be alternately distributed about the edge ring assembly 240. For example, in an example in which four socket recesses 375 and four fastening insert recesses 483 are formed within the edge ring assembly 240, the socket recesses 375 may be positioned at every 90 degrees within the edge ring assembly 240 (e.g., at 0 degrees, 90 degrees, 180 degrees, and 270 degrees about the edge ring assembly 240), and the fastening insert recesses 483 may be positioned at every 90 degrees within the edge ring assembly 240. Further, each fastening insert recess 483 is then positioned between a pair of socket recesses 375 (e.g., at 45 degrees, 135 degrees, 225 degrees, and 315 degrees about the edge ring assembly 240) such that the socket recesses 375 and the fastening insert recesses 483 are alternately distributed about the edge ring assembly 240.

Figure 8:
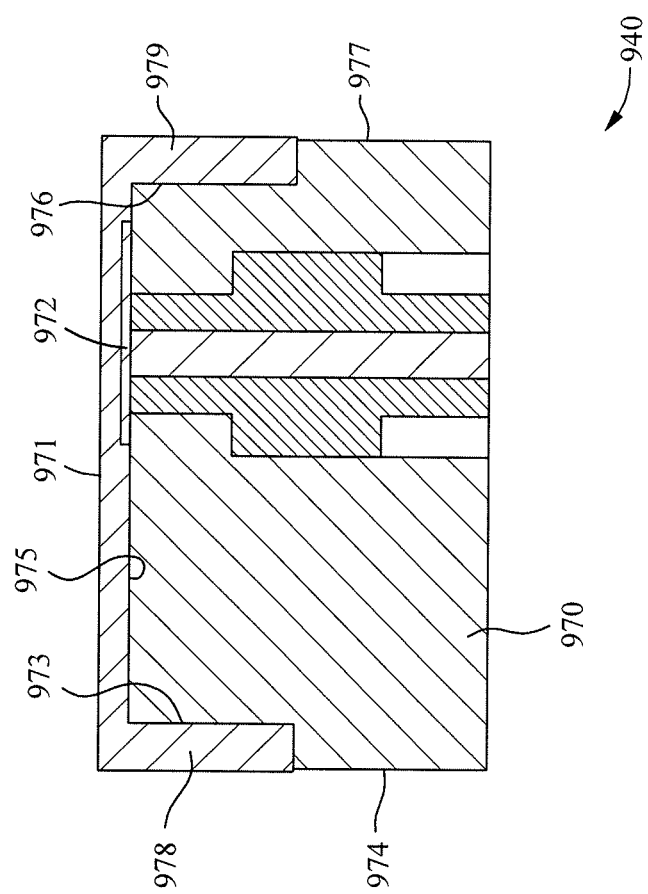
FIG. 8 is a schematic sectional view of an edge ring assembly, according to one aspect of the disclosure.

FIG. 8 is a schematic sectional view of an edge ring assembly 940, according to one aspect of the disclosure. In this example, the edge ring assembly 940 includes a base 970, a cap 971 positioned above the base 970, and an edge ring electrode 972 positioned between the base 970 and the cap 971. Further, the base 970 includes an inner recess 973 formed within an inner surface 974 and/or an upper surface 975 of the base 970, and/or includes an outer recess 976 formed within an outer surface 977 and/or the upper surface 975 of the base 970. In an example in which the base 970 includes the inner recess 973, the cap 971 may include a corresponding inner lip 978 to be positioned within the inner recess 973 of the base 970. In an example in which the base 970 includes the outer recess 976, the cap 971 may include a corresponding outer lip 979 to be positioned within the outer recess 976 of the base 970. This engagement between the cap 971 and the base 970 of the edge ring assembly 940 may increase insulation and/or decrease electric discharge with respect to the edge ring assembly 940.

Figure 9:
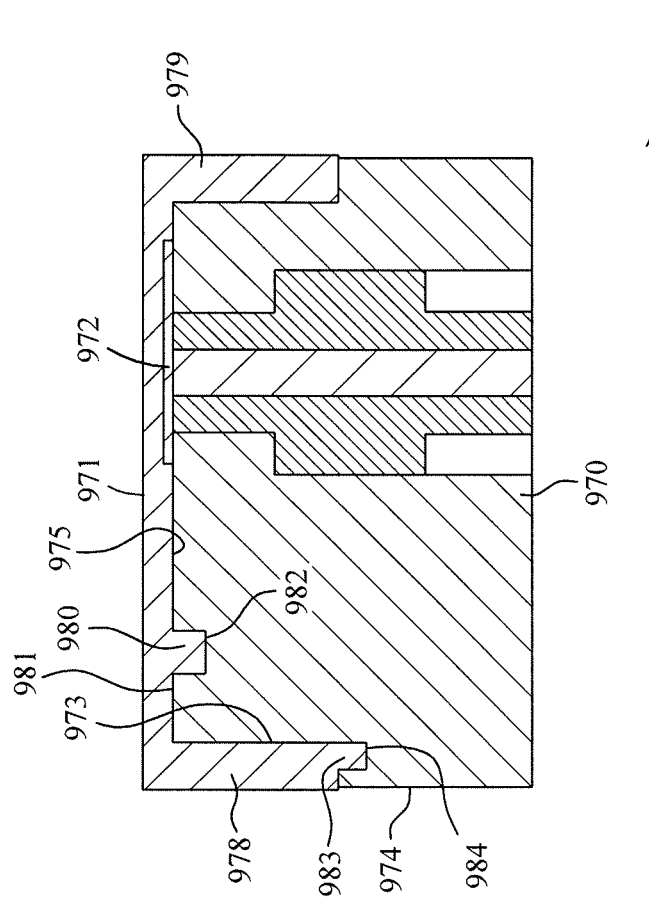
FIG. 9 is a schematic sectional view of a substrate support, according to one aspect of the disclosure.

FIG. 9 is a schematic sectional view of an edge ring assembly 1040, according to one aspect of the disclosure. In this example, the edge ring assembly 1040 includes the base 970, the cap 971, and the edge ring electrode 972. Further, the cap 971 includes one or more protrusions, such as in addition or in alternative to the inner lip 978 and the outer lip 979 that extend into the base 970. For example, the cap 971 includes a protrusion 980 formed on or extending from a lower side 981 of the cap 971 that extends into a groove 982 formed within the upper side 975 of the base 970. Further, in one example, the inner lip 978 of the cap 971 includes a protrusion 983 that extends into a groove 984 formed within the recess 973 of the base 970. Accordingly, the present disclosure contemplates multiple embodiments for an edge ring assembly in accordance with the present disclosure, in addition to those explicitly shown and discussed above.

Figure 10:
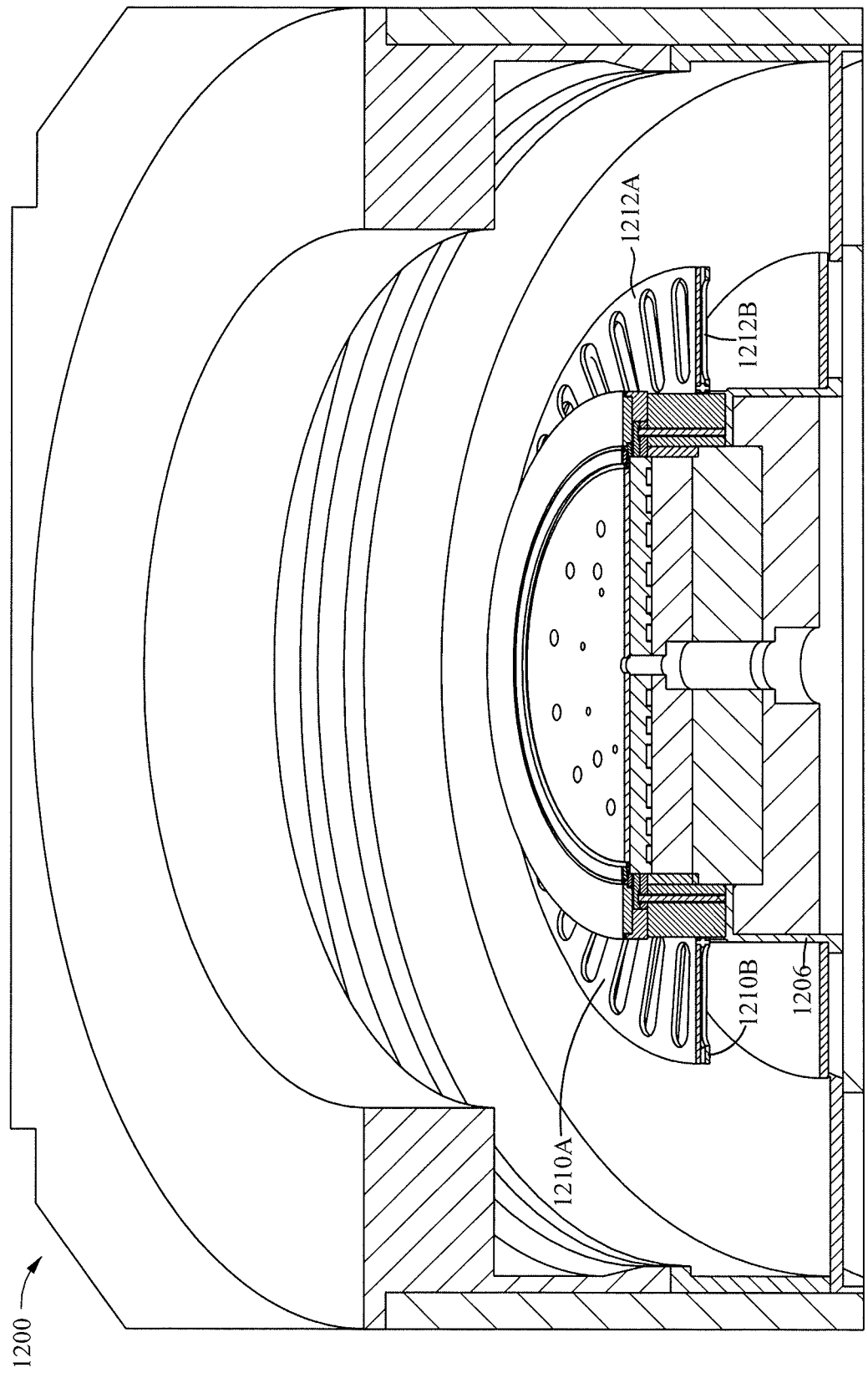
FIG. 10 is a schematic sectional view of a processing chamber with plasma screens, according to one aspect of the disclosure.
Figure 11:
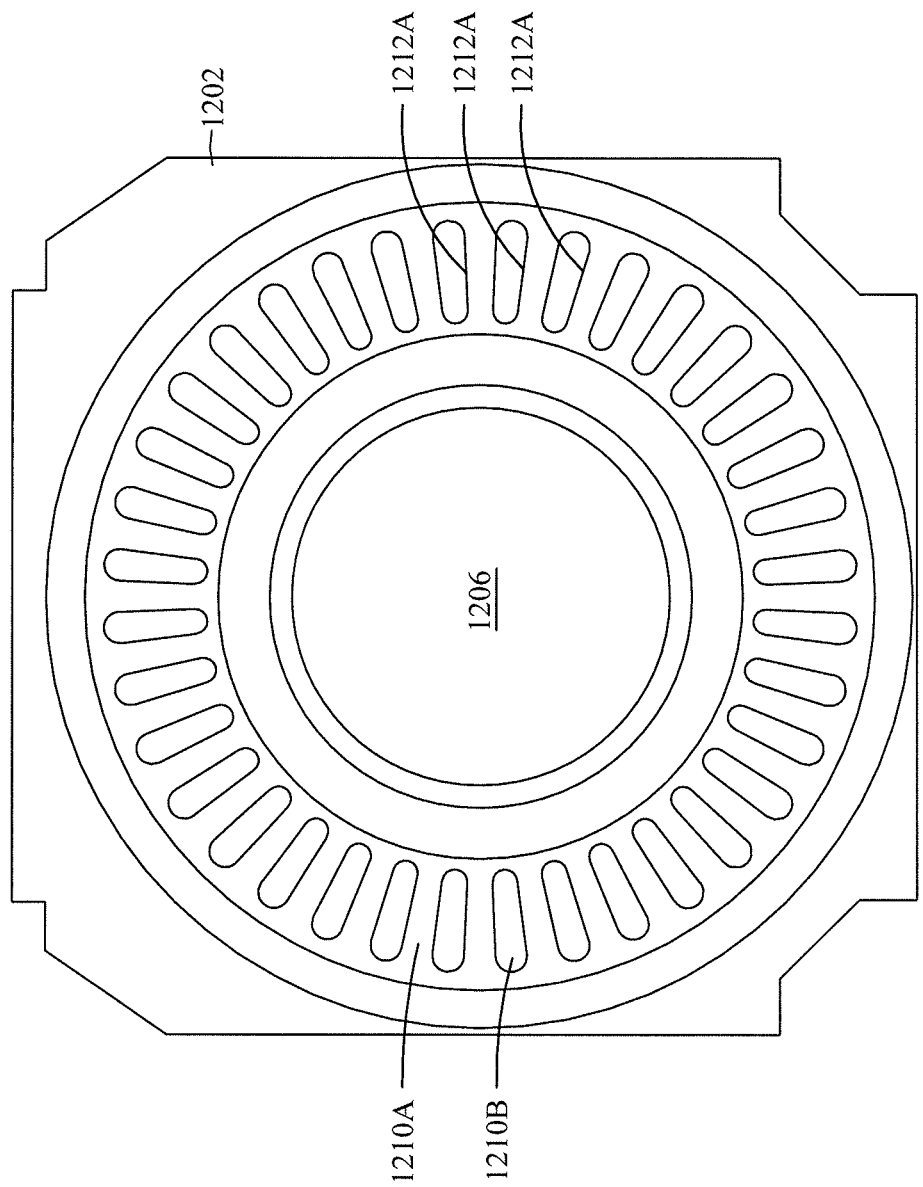
FIG. 11 is a top down view of the processing chamber with the plasma screens shown in FIG. 10, according to one aspect of the disclosure.
Figure 12:
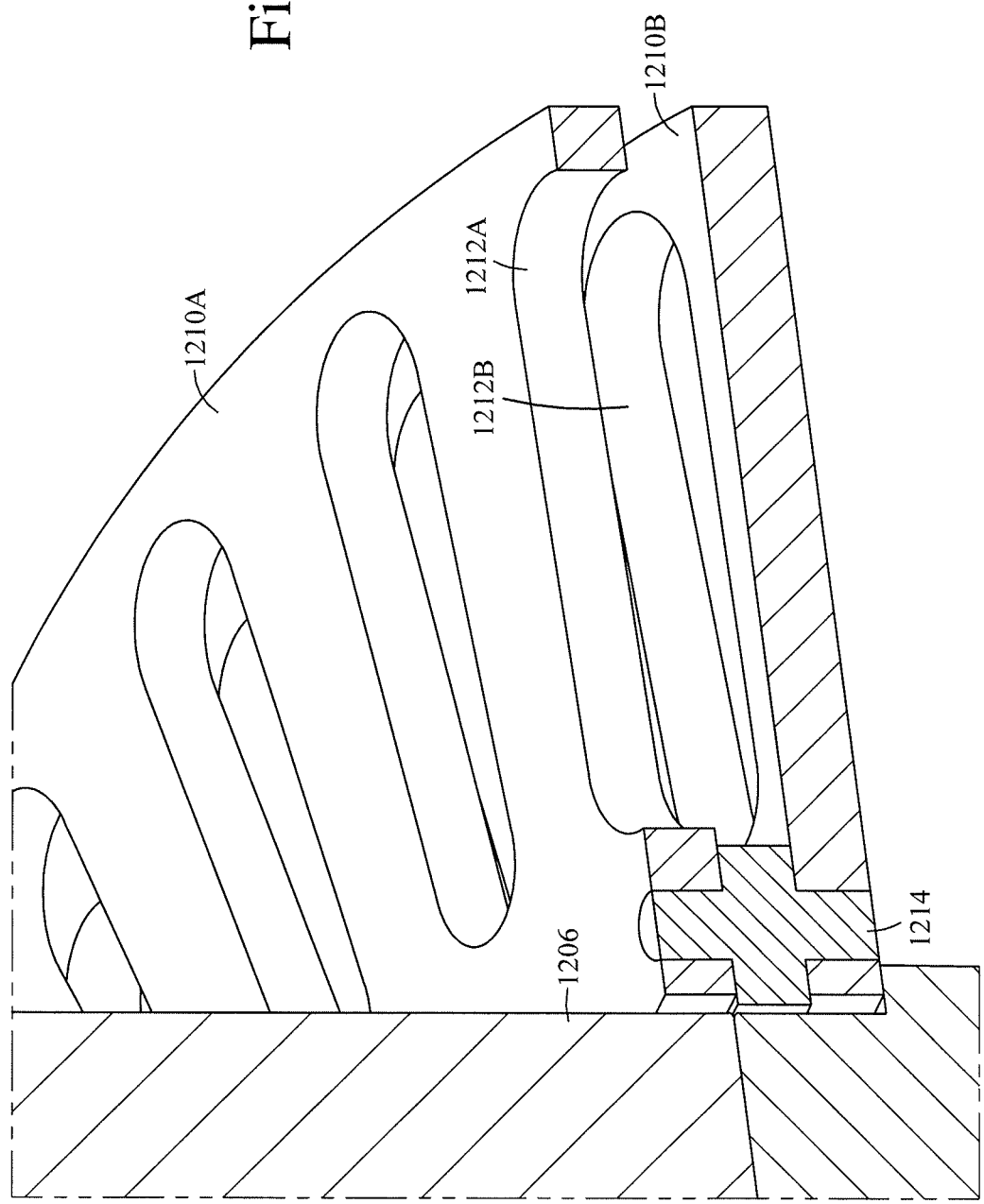
FIG. 12 is a schematic sectional view of the plasma screens, according to one aspect of the disclosure.

FIGS. 10, 11, and 12 are multiple views of plasma screens 1210A and 1210B, according to one aspect of the disclosure. In particular, FIG. 10 is a schematic sectional view of a processing chamber 1200 including a substrate support 1206 with the plasma screens 1210A and 1210B. FIG. 11 is a top down view of the processing chamber 1200 including the substrate support 1206 with the plasma screens 1210A and 1210B. Further, FIG. 12 is a schematic sectional view of the plasma screens 1210A and 1210B. The processing chamber 1200 includes a chamber body 1202 with the substrate support 1206 positioned within the chamber body 1202. Further, the plasma screens 1210A and 12108 extend radially outward from the substrate support 1206, such as by being positioned about and encircling the substrate support 1206 within the chamber body 1202.

The plasma screens 1210A and 1210B include an upper plasma screen 1210A and a lower plasma screen 1210B positioned below the upper plasma screen 1210A. The upper plasma screen 1210A includes one or more openings 1212A formed therethrough, and the lower plasma screen 12108 correspondingly includes one or more openings 1212B formed therethrough. The plasma screens 1210A and 1210B are positioned about the substrate support 1206 such that the openings 1212A of the upper plasma screen 1210A are rotationally offset from the openings 1212B of the lower plasma screen 1210B, such as with respect to an axis of the substrate support 1206. For example, as shown specifically in FIG. 11, a line of sight is obstructed or prevented through the upper plasma screen 1210A and the lower plasma screen 1210B by having the openings 1212A of the upper plasma screen 1210A rotationally offset from the openings 1212B of the lower plasma screen 1210B. The line of sight provided through the openings 1212A of the upper plasma screen 1210A is obstructed or prevented by the lower plasma screen 1210B, as the openings 1212B of the lower plasma screen 1210B do not rotationally overlap with the openings 1212A of the upper plasma screen 1210A.

In one example, the openings 1212A of the upper plasma screen 1210A may be the same number as the openings 1212B of the lower plasma screen 1210B. Further, the openings 1212A of the upper plasma screen 1210A may be the same size and/or shape as the openings 1212B of the lower plasma screen 1210B. Thus, the upper plasma screen 1210A may be identical to the lower plasma screen 1210B.

In one example, the upper plasma screen 1210A may also be rotationally offset from the lower plasma screen 1210B by about one degree, five degrees, or more. For example, in the example shown in FIGS. 10, 11, and 12, the upper plasma screen 1210A and the lower plasma screen 1210B each include thirty-six openings 1212A and 1212B. In such an example, the upper plasma screen 1210A may be rotationally offset from the lower plasma screen 1210B by about five degrees. If fewer openings 1212A and 1212B are included within the upper plasma screen 1210A and the lower plasma screen 1210B, the upper plasma screen 1210A may be rotationally offset from the lower plasma screen 1210B by more than about five degrees. If more openings 1212A and 1212B are included within the upper plasma screen 1210A and the lower plasma screen 1210B, the upper plasma screen 1210A may be rotationally offset from the lower plasma screen 1210B by less than about five degrees.

Further, the upper plasma screen 1210A and/or the lower plasma screen 1210B may be integrally formed with the substrate support 1206, or may be formed separately from and coupled to the substrate support 1206, as shown. In an example in which one or both of the upper plasma screen 1210A and/or the lower plasma screen 1210B are formed separate from the substrate support 1206, one or more spacers 1214 may be positioned between the upper plasma screen 1210A and the lower plasma screen 1210B. The spacers 1214 may facilitate spacing and positioning between the upper plasma screen 1210A and the lower plasma screen 1210B.

Embodiments of the present disclosure can be expressed in one or more of the following examples.

Example 1 includes a substrate support, comprising:
an electrostatic chuck comprising a chucking electrode;
an edge ring assembly positioned exterior to the electrostatic chuck, the edge ring assembly comprising an edge ring electrode;
a silicon ring positioned above the edge ring assembly;
and a power distribution assembly in direct electrical contact with the edge ring electrode.

Example 2 includes the substrate support of example 1, wherein the power distribution assembly is in direct electrical contact with the silicon ring through the edge ring assembly.

Example 3 includes the substrate support of example 1, wherein the edge ring assembly comprises a socket recess formed within a lower surface of the edge ring assembly with a socket positioned within the socket recess of the edge ring assembly.

Example 4 includes the substrate support of example 1, wherein the power distribution assembly extends through an upper surface of the edge ring assembly to directly contact the silicon ring.

Example 5 includes the substrate support of example 4, wherein the silicon ring comprises a recess formed within a lower surface of the silicon ring with the power distribution assembly positioned within the recess of the silicon ring.

Example 6 includes the substrate support of example 5, further comprising a spring contact positioned about and in contact with the power distribution assembly.

Example 7 includes the substrate support of example 5, further comprising a seal positioned about the pin of the power distribution assembly and within the edge ring assembly.

Example 8 includes the substrate support of example 1, wherein the power distribution assembly comprises a pin positionable within a socket.

Example 9 includes the substrate support of example 1, wherein the power distribution assembly comprises an outer sleeve with the pin positioned within the outer sleeve.

Example 10 includes the substrate support of example 1, further comprising a baffle ring with the edge ring assembly positioned above the baffle ring, wherein the power distribution assembly is positioned within the baffle ring.

Example 11 includes the substrate support of example 1, wherein the silicon ring comprises an outer silicon ring, the substrate support further comprising:
an inner silicon ring positioned above the edge ring assembly within the outer silicon ring; and
an insulating ring positioned above the edge ring assembly between the outer silicon ring and the inner silicon ring.

Example 12 includes the substrate support of example 1, wherein the edge ring assembly comprises a cap positioned above a base with the edge ring electrode positioned between the cap and the base.

Example 13 includes a processing chamber, comprising:
a chamber body;
a substrate support positioned within the chamber body, the substrate support comprising:
an electrostatic chuck comprising a chucking electrode;
an edge ring assembly positioned exterior to the electrostatic chuck, the edge ring assembly comprising an edge ring electrode; and
a power distribution assembly in direct electrical contact with the edge ring electrode.

Example 14 includes the processing chamber of example 13, wherein the edge ring assembly comprises a socket recess formed within a lower surface of the edge ring assembly with a socket positioned within the socket recess of the edge ring assembly.

Example 15 includes the processing chamber of example 13, wherein the power distribution assembly is in direct electrical contact with a silicon ring positioned above the edge ring assembly.

Example 16 includes the processing chamber of example 15, wherein the silicon ring comprises a recess formed within a lower surface of the silicon ring with the power distribution assembly positioned within the recess of the silicon ring.

Example 17 includes a method of processing substrates, comprising:
processing a first substrate within a processing chamber comprising a substrate support using a plasma sheath, the substrate support comprising:
an edge ring assembly comprising an edge ring electrode, and
a power distribution assembly in direct electrical contact with the edge ring electrode;
adjusting the plasma sheath within the processing chamber with the edge ring electrode; and
processing a second substrate within the processing chamber using the adjusted plasma sheath.

Example 18 includes the method of example 17, wherein the adjusting the plasma sheath comprises at least one of:
adjusting an electrical property of the edge ring electrode; or
adjusting a property of the power provided to the edge ring electrode.

Example 19 includes the substrate support of example 1, wherein the silicon ring comprises a protrusion that protrudes from a lower surface of the silicon ring and into a recess of the edge ring assembly, the protrusion having a cavity that receives at least a portion of the power distribution assembly.

Example 20 includes the processing chamber of example 15, wherein the silicon ring comprises a protrusion that protrudes from a lower surface of the silicon ring and into a recess of the edge ring assembly, the protrusion having a cavity that receives at least a portion of the power distribution assembly.

Example 21 includes a substrate support, comprising:
an electrostatic chuck comprising a chucking electrode;
an edge ring assembly positioned exterior to the electrostatic chuck, the edge ring assembly comprising an edge ring electrode;
a silicon ring positioned above the edge ring assembly; and
a baffle ring with the edge ring assembly positioned above the baffle ring and clamped to the baffle ring.

Example 22 includes the substrate support of example 21, further comprising a fastening insert recess formed within an outer surface of the edge ring assembly with a fastening insert positioned within the fastening insert recess such that a shoulder of the fastening insert is in engagement with a shoulder of the edge ring assembly in the fastening insert recess.

Example 23 includes the substrate support of example 22, further comprising a fastener recess formed within a lower surface of the baffle ring with a fastener positioned within the fastener recess, wherein the fastener is coupled with the fastening insert to clamp the edge ring assembly to the baffle ring.

Example 24 includes the substrate support of example 22, wherein the shoulder of the fastening insert is formed on a side surface of the fastening insert.

Example 25 includes the substrate support of example 22, further comprising an outer insulating ring positioned exterior to the edge ring assembly with the fastening insert positioned between the outer insulating ring and the edge ring assembly.

Example 26 includes the substrate support of example 22, further comprising a power distribution assembly positioned within the baffle ring and in direct electrical contact with the edge ring electrode.

Example 27 includes the substrate support of example 26, wherein:

the edge ring assembly further comprises a plurality of socket recesses formed within a lower surface of the edge ring assembly;

the fastening insert recess comprises a plurality of fastening insert recesses; and the socket recesses and the fastening insert recesses are alternately distributed about the edge ring assembly.

Example 28 includes the substrate support of example 27, further comprising a plurality of sockets, each positioned within a respective socket recess, wherein the power distribution assembly comprises a plurality of pins, each positioned within a socket.

Example 29 includes the substrate support of example 21, further comprising a mesh flow equalizer with the baffle ring positioned above the mesh flow equalizer and clamped to the mesh flow equalizer.

Example 30 includes the substrate support of example 29, further comprising a fastener recess formed within an upper surface of the baffle ring with a fastener positioned within the fastener recess.

Example 31 includes a processing chamber, comprising:
a chamber body; and
a substrate support positioned within the chamber body, the substrate support comprising:
an electrostatic chuck comprising a chucking electrode;
an edge ring assembly positioned exterior to the electrostatic chuck, the edge ring assembly comprising an edge ring electrode; and
a baffle ring with the edge ring assembly positioned above the baffle ring and clamped to the baffle ring.

Example 32 includes the processing chamber of example 31, further comprising a power distribution assembly positioned within the baffle ring and coupled to the edge ring assembly.

Example 33 includes the processing chamber of example 31, wherein the substrate support further comprises a silicon ring positioned above the edge ring assembly.

Example 34 includes the processing chamber of example 31, wherein the substrate support further comprises a fastening insert recess formed within an outer surface of the edge ring assembly with a fastening insert positioned within the fastening insert recess such that a shoulder of the fastening insert is in engagement with a shoulder of the edge ring assembly in the fastening insert recess.

Example 35 includes the processing chamber of example 34, further comprising a fastener recess formed within a lower surface of the baffle ring with a fastener positioned within the fastener recess, wherein the fastener is coupled with the fastening insert to clamp the edge ring assembly to the baffle ring.

Example 36 includes the processing chamber of example 34, further comprising an outer insulating ring positioned exterior to the edge ring assembly with the fastening insert positioned between the outer insulating ring and the edge ring assembly.

Example 37 includes the processing chamber of example 34, wherein:

the edge ring assembly further comprises a plurality of socket recesses formed within a lower surface of the edge ring assembly;

the fastening insert recess comprises a plurality of fastening insert recesses; and the socket recesses and the fastening insert recesses are alternately distributed about the edge ring assembly.

Example 38 includes the processing chamber of example 31, further comprising a mesh flow equalizer with the baffle ring positioned above the mesh flow equalizer and clamped to the mesh flow equalizer.

Example 39 includes a method of processing substrates, comprising:

processing a first substrate within a processing chamber comprising a substrate support using a plasma sheath, the substrate support comprising:
an edge ring assembly comprising an edge ring electrode; and
a baffle ring with the edge ring assembly positioned above the baffle ring and clamped to the baffle ring;
adjusting the plasma sheath within the processing chamber with the edge ring electrode; and
processing a second substrate within the processing chamber using the adjusted plasma sheath.

Example 40 includes the method of example 39, wherein the adjusting the plasma sheath comprises at least one of:
adjusting an electrical property of the edge ring electrode; and
adjusting a property of the power provided to the edge ring electrode.

Example 41 includes a substrate support, comprising:
an electrostatic chuck comprising a chucking electrode;
an edge ring assembly positioned exterior to the electrostatic chuck, the edge ring assembly comprising:
a base comprising:
an inner recess formed within an inner surface of the base; and
an outer recess within an outer surface of the base;
a cap positioned above the base and comprising:
an inner lip positioned within the inner recess of the base; and
an outer lip positioned within the outer recess of the base; and
an edge ring electrode positioned between the cap and the base;
a silicon ring positioned above the edge ring assembly; and
a baffle ring with the edge ring assembly positioned above the baffle ring.

Example 42 includes the substrate support of example 41, wherein the base comprises a shoulder positioned on the outer surface of the base.

Example 43 includes the substrate support of example 41, further comprising a pipe ring with the baffle ring positioned exterior to the pipe ring, the edge ring assembly positioned above the pipe ring, and the pipe ring positioned about the electrostatic chuck.

Example 44 includes the substrate support of example 41, wherein the base and the cap comprise ceramic.

Example 45 includes the substrate support of example 41, wherein the edge ring electrode comprises a thickness of about 0.2 inches to about 0.4 inches.

Example 46 includes the substrate support of example 41, further comprising a power distribution assembly coupled to the edge ring assembly.

Example 47 includes the substrate support of example 41, wherein the cap further comprises a protrusion positioned within an upper surface of the base.

Example 48 includes the substrate support of example 41, wherein the inner lip comprises a protrusion positioned within the inner recess of the base.

Example 49 includes a processing chamber, comprising:
a chamber body; and
a substrate support positioned within the chamber body, the substrate support comprising:
an electrostatic chuck comprising a chucking electrode; and
an edge ring assembly positioned exterior to the electrostatic chuck, the edge ring assembly comprising:
a base comprising an inner recess formed within an inner surface of the base and an outer recess within an outer surface of the base;
a cap positioned above the base and comprising an inner lip positioned within the inner recess of the base and an outer lip positioned within the outer recess of the base; and
an edge ring electrode positioned between the cap and the base.

Example 50 includes the processing chamber of example 49, wherein the substrate support further comprises:
a silicon ring positioned above the edge ring assembly; and
a baffle ring with the edge ring assembly positioned above the baffle ring.

Example 51 includes an edge ring assembly, comprising:
a base comprising:
an inner recess formed within an inner surface of the base; and
an outer recess within an outer surface of the base;
a cap positioned above the base and comprising:
an inner lip positioned within the inner recess of the base; and
an outer lip positioned within the outer recess of the base; and
an edge ring electrode positioned between the cap and the base.

Example 52 includes the edge ring assembly of example 51, wherein the base and the cap comprise ceramic.

Benefits of the present disclosure may include increased control of plasma adjacent edges of a substrate. The increased plasma control results in increased processing uniformity, particularly near edges of the substrate. Additionally, plasma adjustment according to aspects of the present disclosure occurs locally at the substrate edge, thus not adversely affecting plasma uniformity across the substrate surface. The present disclosure may further be able to facilitate arrangement, insulation, and conductivity amongst the components within a substrate support, which may decrease electrical discharge and increase insulation. This, in turn, may increase the useful life of one or more components within the substrate support. Further, the present disclosure may have one or more components clamped to each other to facilitate assembly, disassembly, and/or replacement of one or more components of a substrate support.

While the foregoing is directed to aspects of the present disclosure, other and further aspects of the disclosure may be devised without departing from the basic scope thereof, and the scope thereof is determined by the claims that follow.

What is claimed is:

1. A substrate support, comprising:
an electrostatic chuck comprising a chucking electrode;
an edge ring assembly positioned exterior to the electrostatic chuck, the edge ring assembly comprising an edge ring electrode;
an outer silicon ring positioned above the edge ring assembly;
an inner silicon ring positioned above the edge ring assembly within the outer silicon ring;
an insulating ring positioned above the edge ring assembly between the outer silicon ring and the inner silicon ring; and
an outer insulating ring positioned exterior to the edge ring assembly to encircle the edge ring assembly, wherein:
the outer silicon ring is positioned above the outer insulating ring, and
the outer insulating ring comprises an upper recess formed within an upper surface of the outer insulating ring with the outer silicon ring positioned within the upper recess of the outer insulating ring.

2. The substrate support of claim 1, wherein:
the outer silicon ring is positioned exterior to the insulating ring to encircle the insulating ring; and
the insulating ring is positioned exterior to the inner silicon ring to encircle the inner silicon ring.

3. The substrate support of claim 1, wherein:
the insulating ring comprises an inner recess formed within an inner surface of the insulating ring and an outer recess formed within an outer surface of the insulating ring;
the inner silicon ring is at least partially positioned within the inner recess; and
the outer silicon ring is at least partially positioned within the outer recess.

4. The substrate support of claim 1 wherein the insulating ring and the outer insulating ring comprise quartz.

5. The substrate support of claim 1, wherein:
the electrostatic chuck comprises a conductive plate with a ceramic plate positioned on top of the conductive plate;
the ceramic plate comprises an upper recess formed within an upper surface of the ceramic plate with the inner silicon ring positioned within the upper recess of the ceramic plate; and
the inner silicon ring comprises an upper recess formed within an upper surface of the inner silicon ring such that the upper surface of the ceramic plate and the upper recess of the inner silicon ring are co-planar.

6. The substrate support of claim 1, further comprising a baffle ring with the edge ring assembly positioned above the baffle ring.

7. The substrate support of claim 6, further comprising a pipe ring with the baffle ring positioned exterior to the pipe ring.

8. The substrate support of claim 1, wherein the edge ring assembly comprises a cap positioned above a base with the edge ring electrode positioned between the cap and the base.

9. The substrate support of claim 1, further comprising a power distribution assembly coupled to the edge ring assembly.

10. A processing chamber, comprising:
a chamber body; and
a substrate support positioned within the chamber body, the substrate support comprising:
an electrostatic chuck comprising a chucking electrode;

an edge ring assembly positioned exterior to the electrostatic chuck, the edge ring assembly comprising an edge ring electrode;
an outer silicon ring positioned above the edge ring assembly;
an inner silicon ring positioned above the edge ring assembly within the outer silicon ring;
an insulating ring positioned above the edge ring assembly between the outer silicon ring and the inner silicon ring; and
an outer insulating ring positioned exterior to the edge ring assembly to encircle the edge ring assembly, wherein:
the insulating ring comprises an inner recess formed within an inner surface of the insulating ring and an outer recess formed within an outer surface of the insulating ring,
the inner silicon ring is at least partially positioned within the inner recess,
the outer silicon ring is at least partially positioned within the outer recess,
the outer silicon ring is positioned above the outer insulating ring, and
the outer insulating ring comprises an upper recess formed within an upper surface of the outer insulating ring with the outer silicon ring positioned within the upper recess of the outer insulating ring.

11. The processing chamber of claim 10, wherein the edge ring assembly comprises a cap positioned above a base with the edge ring electrode positioned between the cap and the base.

12. The processing chamber of claim 10, further comprising a power distribution assembly coupled to the edge ring assembly.

13. A method of processing substrates, comprising:
processing a first substrate within a processing chamber comprising a substrate support using a plasma sheath, the substrate support comprising:
an electrostatic chuck comprising a chucking electrode;
an edge ring assembly positioned exterior to the electrostatic chuck, the edge ring assembly comprising an edge ring electrode;
an outer silicon ring positioned above the edge ring assembly;
an inner silicon ring positioned above the edge ring assembly within the outer silicon ring;
an insulating ring positioned above the edge ring assembly between the outer silicon ring and the inner silicon ring; and
an outer insulating ring positioned exterior to the edge ring assembly to encircle the edge ring assembly, wherein:
the outer silicon ring is positioned above the outer insulating ring, and
the outer insulating ring comprises an upper recess formed within an upper surface of the outer insulating ring with the outer silicon ring positioned within the upper recess of the outer insulating ring;
adjusting the plasma sheath within the processing chamber with the edge ring electrode; and
processing a second substrate within the processing chamber using the adjusted plasma sheath.

14. The method of claim 13, wherein the adjusting the plasma sheath comprises at least one of: adjusting an electrical property of the edge ring electrode; or adjusting a property of the power provided to the edge ring electrode.

15. The method of claim 13, wherein the substrate support further comprises a power distribution assembly coupled to the edge ring assembly, and the adjusting the plasma sheath comprises adjusting power provided by the power distribution assembly.

16. The method of claim 13, wherein:
the outer silicon ring is positioned exterior to the insulating ring to encircle the insulating ring; and
the insulating ring is positioned exterior to the inner silicon ring to encircle the inner silicon ring.

* * * * *